United States Patent [19]

Norman

[11] 4,337,134
[45] Jun. 29, 1982

[54] CONTINUOUS TRUCK MOUNTED PRINTED CIRCUIT BOARD PLATING SYSTEM

[75] Inventor: Richard O. Norman, Oxnard, Calif.

[73] Assignee: Elfab Corporation, Dallas, Tex.

[21] Appl. No.: 125,245

[22] Filed: Feb. 27, 1980

[51] Int. Cl.³ .................. C25D 17/06; C25D 21/04; C25D 21/10

[52] U.S. Cl. .................. 204/198; 204/223; 204/278

[58] Field of Search .............. 204/198, 199, 200, 201, 204/202, 203, 204, 205, 224 R, 224 M, 278, 208, 52 R, 435, 54 R, 15, 17, 18 R, 18 PC, 20, 222, 223; 414/352, 561, 562, 569, 567, 688, 689

[56] References Cited

U.S. PATENT DOCUMENTS

| | | | |
|---|---|---|---|
| 1,723,480 | 8/1929 | Hannon | 204/278 X |
| 1,801,011 | 4/1931 | Koeppen | 204/278 |
| 2,958,330 | 11/1960 | Huenerfauth | 204/198 X |
| 3,381,695 | 5/1968 | Clark | 204/198 X |
| 3,684,681 | 8/1972 | Dibble | 204/198 |
| 4,028,211 | 6/1977 | Hirakawa et al. | 204/198 X |
| 4,032,414 | 6/1977 | Helder et al. | 204/224 R X |
| 4,131,531 | 12/1978 | Kaneko et al. | 204/208 |

Primary Examiner—T. M. Tufariello
Attorney, Agent, or Firm—Thomas Crisman; Stanley R. Moore

[57] ABSTRACT

A printed circuit board plating line which includes a plurality of trucks mounted on trolleys for linear movement above a series of spaced cleaning, plating and etching tanks for transportation of printed circuit board material through the tanks under continuous computer control. The cleaning, plating and etching operations are arranged in two groups of tanks. Following the traverse of the first group of tanks, the printed circuit boards are removed from their respective plating racks which depend from the moveable trucks, and sent through an inspection operation which ensures the image plated thereon is accurate. The boards are then removed on truck suspended racks and proceed through the second group of tanks for image plating. The continuous printed circuit board manufacturing line minimizes the quantity of work in process, requires only a few personnel of relatively unskilled background, and is environmentally clean and non-polluting.

16 Claims, 13 Drawing Figures

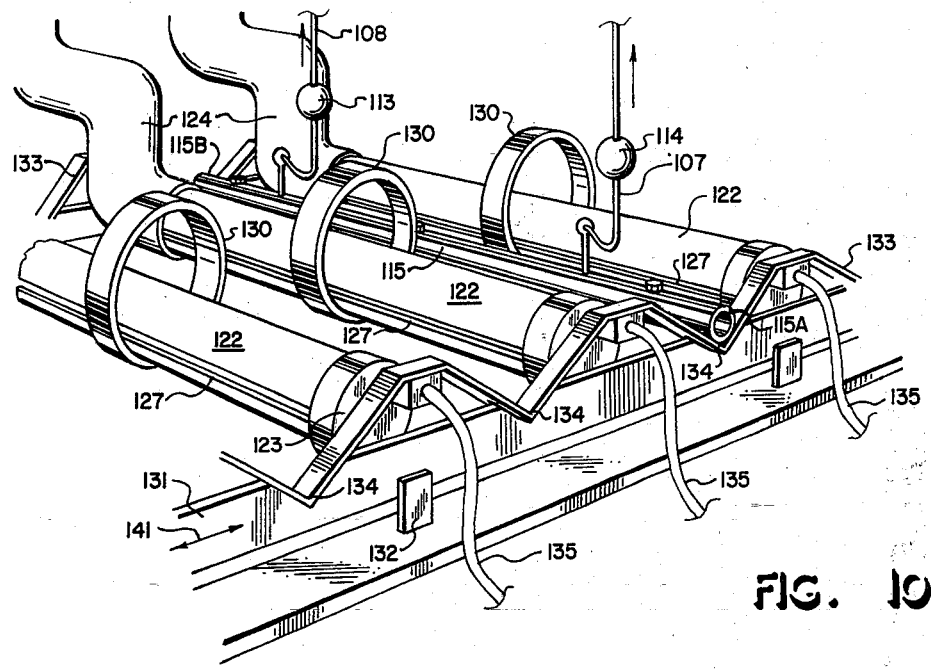
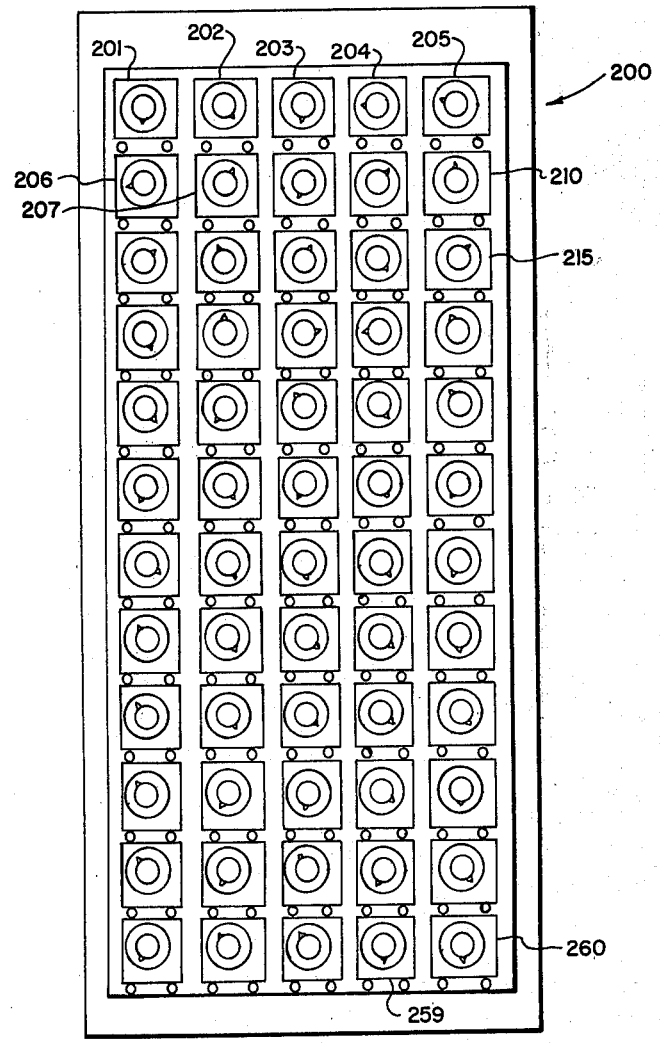
FIG. 10
FIG. 11

CONTINUOUS TRUCK MOUNTED PRINTED CIRCUIT BOARD PLATING SYSTEM

BACKGROUND OF THE INVENTION

1. Field of the Invention

The invention relates to printed circuit board plating operations, and more particularly, to a continuous, computer controlled printed circuit board plating system.

2. History of the Prior Art

In the past, printed circuit board plating operations have included a necessity for placing a plurality of individual printed circuit boards onto a rack and then manually moving the rack through various cleaning tanks and plating tanks in a manner so as to produce uniformly controlled thickness of plating on the boards in a desired pattern. Such operations are relatively unautomated in the sense that an operator is used to both load and unload the racks as well as to time and move the racks from tank to tank in order to ensure a controlled thickness of copper both within holes formed through the boards and upon the surface of the boards themselves.

Improved printed circuit board plating operations have included computer controlled movement of racks from tank to tank. That is, the tank withdrawal operator is replaced by a timing mechanism which precisely measures the amount of time that the boards have been in a particular tank and withdraws the rack whenever a desired thickness of copper has been placed upon the boards. Such computer control devices still require operator monitoring to physically load and transfer the racks of printed circuit boards from tank to tank following the automatic withdrawal from the previous tank based upon a computer controlled timing circuit.

Additionally, prior art printed circuit board plated operations have been inherently wet, messy, and odoriferous. Such operations have also been characterized by the discharge of substantial quantities of vaporous and liquid pollutants from the system into the environment. On the other hand, the printed circuit board line of the present invention is clean and dry and is also relatively vapor free due to a noxious vapor removal subsystem which withdraws fumes from above the tanks and circulates the air through a scrubber prior to releasing it into the atmosphere. Additionally, the fluids and, in particular, the water based fluids are operated in a closed system. That is, all of the fluids which contain environmentally polluting ingredients are processed by a reverse osmosis system which recovers substantially all of the metal salts used in the plating operation and produces water which is virtually pure. The water is then suitable for reuse or for disposal in a manner which would not be permitted without the operation of the cleansing system and the metal salts recovered may be sold as scrap.

Finally, the plating system of the present invention reduces the quantity of "work in progress" due to the fact that the operation is continuous from raw stock to finished product. Conventional plating operations often have days to weeks of inventory work in progress which is being transferred from stage to stage in the plating and board manufacturing operation but which accounts for a substantial investment in inventory. The system of the invention is capable of producing finished printed circuit boards from start to finish in a total elapsed time of approximately six days rather than the several weeks of the prior art systems. The only queing of materials is at the head of the line as the material is placed into the continuous process. The continuous operation similarly reduces any backlog from a shutdown or delay in a specific operation in the sense that any holdup in the continuous operation is immediately flagged. For example, if a large quantity of materials stacks up at a particular inspection station, this alerts management to provide additional assistance at that particular station in order to guard against a delay or slowdown in the whole system due to difficulties encountered in one individual work station. In addition, the plating line of the present invention may be easily manned with relatively few employees. The only operations which are manually required are inspections which are made at specific fixed locations. The remainder of the operations of the system of the invention are under control by a computer or other automated production control facility.

SUMMARY OF THE INVENTION

The invention relates to a continuous printed circuit board plating operation. In particular, to a continuous, computer controlled printed circuit board plating system which includes automatically controlled trucks operating on trolley tracks which move the printed circuit boards to be plated in a continuous path through the plating tanks under control of automation equipment.

In one aspect of the present invention, a continuous printed circuit board processing system comprises a series of sequentially arranged printed circuit board treatment tanks and a trolley track formed in a loop with a portion of the track overlying the treatment tanks. A plurality of trolley trucks are mounted for movement upon the track, each of the trucks including means for supporting a printed circuit board to be processed and energizable means for raising and lowering the board into and out of the processing tanks. Energizable means are provided for moving each of the trolley trucks along the track. Control means are also provided for selectively energizing the truck moving means, the board lowering means and the board raising means in sequence to effect the processing of the printed circuit boards.

In another aspect, the present invention relates to an improved printed circuit board processing system of the type including a series of printed circuit board treatment tanks for treating a printed circuit board lowered therein, the tanks containing treatment fluids of the noxious vapor variety. The improvement includes a trolley track formed in a loop with a portion of the track overlying the treatment tanks disposed thereunder in sequential arrangement. A plurality of trolley trucks are mounted for movement upon the track, each of the trucks including means for supporting a printed circuit board to be processed and energizable means for raising and lowering the board into and out of the processing tanks. Energizable means are provided for moving each of the trolley trucks along the track in conjunction with control means for selectively energizing the truck moving means, the board lowering means and the board raising means in sequence to effect the processing of the printed circuit boards. Means are also provided for for collecting and removing noxious vapors from the treatment tanks.

In yet another aspect, the present invention includes an improved printed circuit board processing system as set forth above wherein the noxious vapor collection and removal means comprises a plurality of transversely extending headers, each header havisng a slit portion for receiving the noxious vapor therein and being disposed adjacent the treatment tank. A manifold is provided in flow communication with the headers and a suction system is coupled to the manifold for drawing the noxious vapor therein.

BRIEF DESCRIPTION OF THE DRAWINGS

For a more complete understanding of the present invention and for further objects and advantages thereof, reference may now be had to the following description taken in conjunction with the accompanying drawings in which:

FIG. 10 is a perspective view of a top of a plating tank illustrating the noxious vapor removal system and the printed circuit board agitating system used in the present invention;

FIG. 11 is a bank of timers used to actuate the trucks in accordance with the teachings of the invention;

DETAILED DESCRIPTION OF THE DRAWINGS

Figure 1:
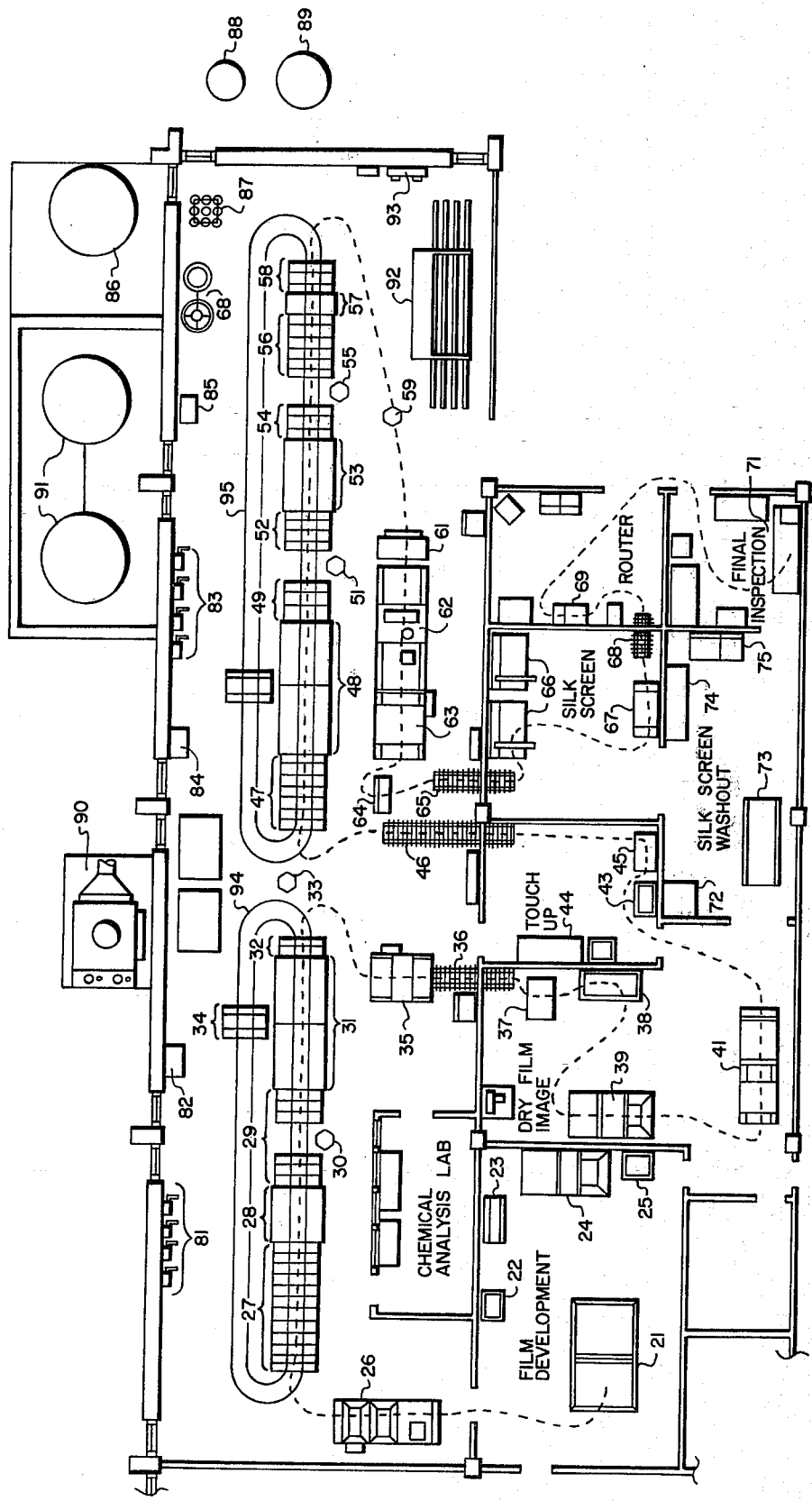
FIG. 1 is a schematic diagram of a system constructed in accordance with the teachings of the present invention.

Referring to FIG. 1, there is shown a top schematic view of a printed circuit board plating system constructed in accordance with the teachings of the invention. The first operation takes place in the film development area at which a coordinatograph 21 is used to examine the artwork which has been prepared to transfer the circuitry depicted in a drawing onto the printed circuit board to be manufactured. The coordinatograph 21 is used to compare the artwork to the basic drawing of the patterns to be formed upon the printed circuit board and ensure that the artwork is correct. The film development area also includes a light table 22 used for inspection of artwork, a film developer 23 and an artwork copying maching 24.

From film development the raw G-10 substrate material is first passed into a vapor honing machine 26. The boards to be processed from the printed circuit board area have previously been drilled through with holes in desired aligned rows, for example, for use in mounting of electrical connectors upon those printed circuit board substrates. Vapor honing removes small metal slivers from the surface of the drilled board stock. After vapor honing by the device 26, the drilled panels are then placed on large racks, as will be discussed more fully below, and begin their procession through a plurality of plating and treatment tanks.

The first group of tanks 27 comprise approximately twelve individual treatment tanks each of which contain a cleaning solution. Thus, the board member which initially starts as a sheet of G-10 glass epoxy resinous material clad on both sides with a thin sheet of copper material, is first drilled through with a plurality of holes and then cleaned such that the material is prepared for subsequent plating. The second group of tanks after cleaning, are the tanks 28 which comprise a series of electroless copper plating tanks which deposit a very thin plating of copper on the insides of the holes which have been drilled through the glass epoxy fiberglass material, Next, the boards having electroless copper plating within the drilled holes are cleaned again by passing through a series of tanks 29. After the electroless copper is deposited on the drilled boards in the tanks 28 and the boards cleaned in tank 29, the boards are paused at a second inspection station 30 where the boards are physically inspected to determine whether or not sufficient copper has been deposited in the drilled holes by means of the electroless plating tank 29. Following inspection at location 30, the boards are passed through the remainder of the cleaning tanks 29 and then into the diverse copper plating tanks 31.

It is necessary to have a minimum amount of copper in the holes from the electroless plating operation in order to provide conductivity within the holes. Through hole conductivity is required such that in the copper plating operation additional copper is plated onto the inner walls of the holes. In the copper plating tanks 31, the first relatively thick layer of copper is deposited into the hole walls. After the first set of copper plating tanks 31 the boards are then passed through a pair of additional cleaning tanks 32 and then inspected at station 33 where the thickness of copper plated in the holes is ascertained to make sure that sufficient copper has been deposited during the first plating operation. At this point, the printed circuit board panels are removed from the racks which have been used to transport them to this point through the plating tanks. The trucks pass on around the oval trolley track and the racks are passed on through a rack plating stripping tank 34 where the copper which has been deposited on the racks during their passage from stations 27 through 32 is removed. The racks are returned to the head of the conveyor line prior to station 27 for attachment of additional panels to pass sequentially through the plating operation.

The boards having a first layer of copper plating formed in the drilled holes thereof are then passed through the scrubber 35 and through a conveyor 36 into a dry film image room where a resist is applied which will be used to place the artwork image onto the panels. The boards are first passed through a laminator 37 where the resist image is applied directly to the surface of each board. The boards are then placed on a light table 38 along with the negative for inspection to ensure a proper application of the resist image to the board.

Next, the board with the image applied is passed through an exposure 39 to evenly expose the resist to light. One type of suitable exposer 39 is sold under the tradename of "Scanex II." The boards are then passed through a chemcut developer 41 to develop the exposed image on the boards. Each board is next passed into a touch-up room which includes a pair of light tables 42 and 43 and an inspection station 45. At the inspection station 45 the quality of the images is inspected and in the event any individual hand touch-up is required it is applied at station 44 during this operation. The boards are passed out a conveyor system 46 and reassembled to the racks as will be discussed in greater detail below.

After attachment of the panels to the truck mounted racks, the panels are first passed through a series of cleaning tanks 47 to ensure a clean surface for plating and thence into a series of second copper plating tanks 48 in which copper is plated on a pattern in accordance with the resist image previously applied to the surface of the boards. After image plating, the boards are next passed through a series of cleaning tanks 49 and thereafter inspected at station 51 for the sufficiency of copper in the holes passing through the boards. After inspection the boards are next again cleaned in a series of tanks 52 and thence passed into tin lead plating tanks 53 wherein a tin-lead solder coating is applied to each surface to which copper was applied in tanks 48. Following tin-lead plating the boards are again cleaned in a series of tanks 54 and then inspected at station 55 to determine the quality of the tin-lead plating upon the image which had been previously applied to the boards.

Following inspection, the boards are passed through a series of stripping tanks 56 and then into an etcher 57 which etches away and removes all of the copper except that which is protected by the tin-lead plating applied over the copper plating located on the areas to which a resist image was not applied to the boards. Upon etching away of the undesired copper material, the boards are then again finally cleaned in the tanks 58 and reinspected at station 59 to determine whether or not any opens or shorts exist in the plated areas on the board. After inspection the boards are passed first through a dryer 61 and then into a reflow machine 62 within which the tin-lead plating is heated to its melting temperature and reflowed. Reflowing removes any solder icycles which may have formed between adjacent plated areas or within any of the plated through holes as well as providing a shiny cosmetically attractive surface. Following reflow, the boards are passed through a scrubber 63 which roughs up the surface of the reflowed boards and they are inspected again at station 64 for opens and shorts that may not have been corrected by the reflowing operation.

After the reflow inspection, the boards are again passed through a conveyor system 65 and are then printed on silk screen printing tables 66 to add printed designations to the surface of the boards as required by the customer for whom the boards are being fabricated. The silk screen operation is supported by a silk screen wash out at which includes a frame holder 72, a plate maker 73, a wash out 74 and a sink 75. Thus the silk screens may be washed out and reused in a very expeditious manner. The silk screened printing is then cured in an ultraviolet curing system 67 and the boards are passed through another small conveyor operation 68 into a routing room. Here the finished boards are cut from large panels into individual boards by means of a routing machine 69. Next they enter a final inspection station 71 at which every aspect of the board is inspected for final approval. For example, in the event an insufficient etching operation leaves undesired conductive bridges between any portions of the board, the board is then manually placed back into the etcher for a few seconds to remove those bridges. It is a particular advantage of the present continuous system operation which enables a board to be placed back into a previous station for reprocessing in the event any correction needs to be made.

Other components of the system of the invention are shown in FIG. 1 in schematic form. The first plating line, line A, comprises plating tanks 27–32. Each of the tanks includes a heating element to control the temperature of the various cleaning and plating solutions. The heater controls for line A are identified by character 81. The rectifier providing power for the first copper plating tanks 31 is identified by character 82. The heater control for the second plating line comprising tanks 47–58, line B, is identified by character 83 while the power rectifier for the second copper plating line is shown at 84. The rectifier for the tin-lead solder plating tanks 53 is identified by 85. The etching tanks 57 are preferably of the hydro-etch type and include chill and settle tanks 86. Deionized water is provided by a large storage tank 86 and secondary tanks 87. The holding tanks 88 and 89 provide temporary storage for fluids while large waste tanks 91 provide a waste holding system to be pumped and trucked away periodically without polluting any of the environmental systems related to the plating system of the present invention. Additionally, an air scrubber 90 is provided to remove noxious vapors from the air as will be further explained below.

The system also includes a reverse osmosis system 92 which is controlled by a power control panel 93. The reverse osmosis system removes pollutants from the water such that the water may be cycled through and reused without polluting the environment.

In FIG. 1, both the plating lines including tanks 27–32 on line A and tanks 47–58 on line B are overlayed, respectively, by two generally oval trolley track systems 94 and 95. Tracks 94 and 95 each have a pair of spaced parallel rails from which are suspended a plurality of individual trucks as will be more fully explained below in connection with FIG. 2.

Figure 2:
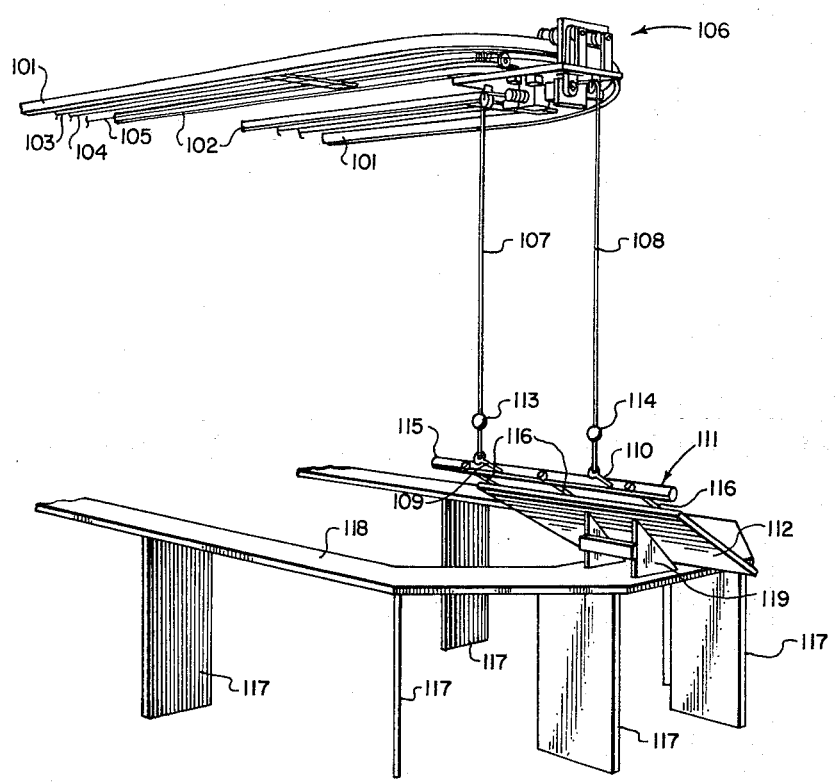
FIG. 2 is a perspective view of a truck and trolley conveyor system employed in conjunction with the invention as boards are being loaded and/or unloaded therefrom.

In FIG. 2, there is shown a perspective view of a plating line showing a single truck mounted on the trolley rails and having depending therefrom a printed circuit board mounting rack. More specifically in FIG. 2, there is shown a pair of support rails 101 and 102 between which are mounted three power control buses 103–105. A truck 106 is mounted upon the rails 101–102. A pair of suspension cables 107–108 extend from the truck 106 and are raised and lowered by capstain means mounted on the truck. Each of the cables 107 and 108 includes, respectively, a hook 109 and 110 at the lower ends thereof for attachment to the rack 111 to which printed circuit board substrates to be plated 112 are fixed. The cables 107 and 108 also include at the lower ends thereof a pair of lead weights 113 and 114 to provide adequate tension on the cables even when they are not under load. The rack 111 includes a horizontal central support bar 115 conformed of a conductive metal material and a plurality of vertically depending conductive support bars 116. The elements of rack 111 are made of conductive material so that when the conductive elements of the printed circuit board to be plated 112 are affixed thereto, a conductive path is established from each element of the rack to each portion of the printed circuit board 112.

FIG. 2 illustrates means facilitating the loading and unloading of the printed circuit boards 112 from the rack 111. These means comprise a plurality of vertically extending supports and a horizontal table portion 118. A wedge shaped support rack 119 is provided at a U-shaped portion of the table 118 such that when rack 111 containing a board 112 is lowered from the truck 106, the wedge shaped support 119 provides a resting place for the board convenient for the operator to remove and add screws by which the panels 112 are affixed to the vertical support bars 116 of the rack 111. A support structure is found at both the beginning and the end of each of the two tracks 94 and 95 of plating lines A and B (FIG. 1).

Figure 3:
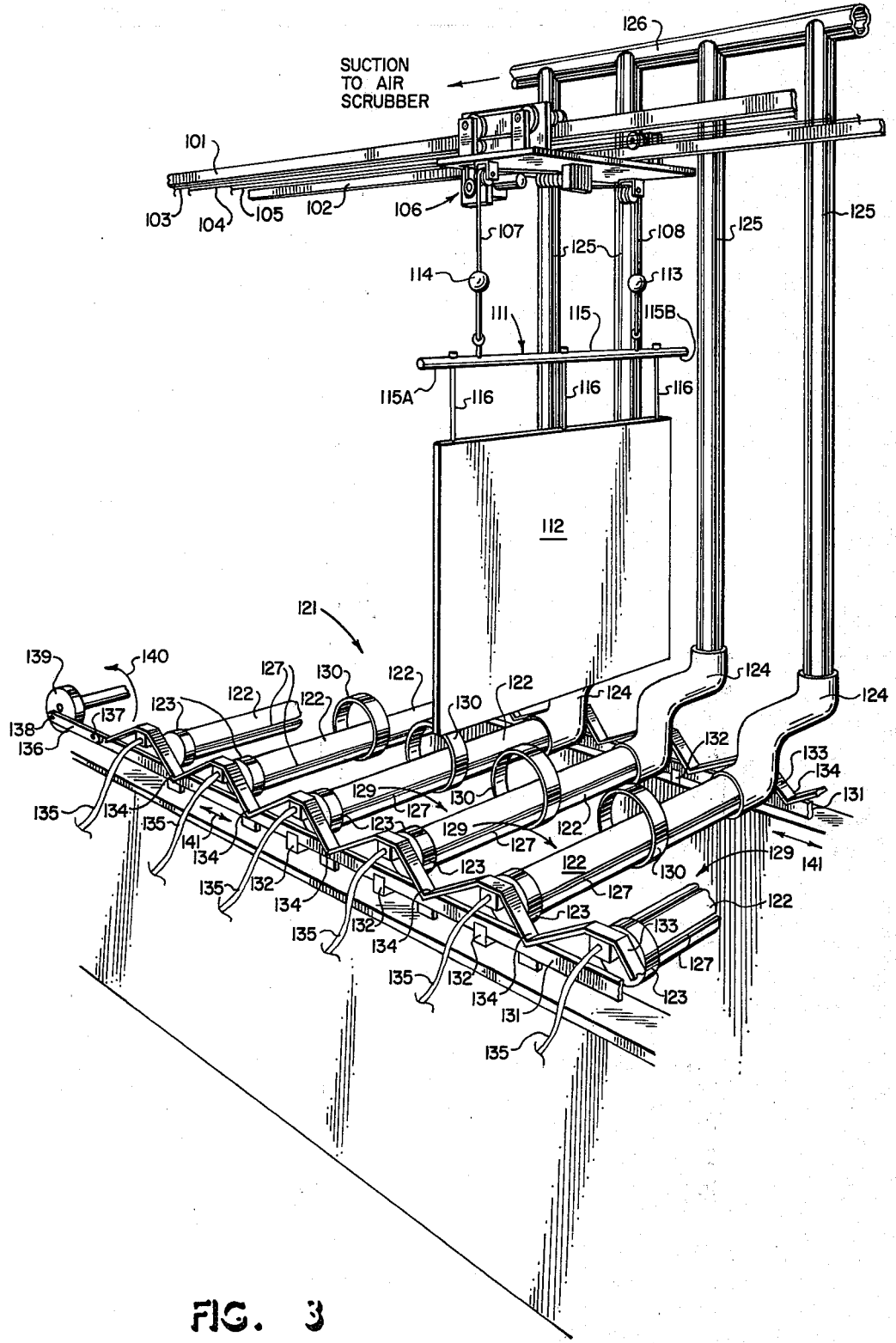
FIG. 3 is a perspective view of the truck and trolley system as a rack of printed circuit boards is being transferred from one tank to another.

Referring next to FIG. 3, there is shown a perspective view of a truck 106 supporting a circuit panel 112 being plated above a plurality of plating tanks 121. As shown, the support cables 107 and 108 are shown in the up position so that the printed circuit panel 112 is well above the tops of any of the plating tanks so that the truck 106 may be moved along the rails 101 and 102 to transport the panel 112 from one processing tank to the next adjacent processing tank in accordance with the teachings of certain aspects of the present invention.

Referring to the plating tanks 121, it may be seen that overlying the space barrier separating adjacent one of the tanks is a noxious vapor removal system. This system comprises a plurality of transversely extending headers 122 each of which has a cap 123 on the terminal end and a vertical riser tube 125. The vertical riser tubes 125 are connected to a manifold 126 which is coupled to a suction system originating with the air scrubber 92 shown in FIG. 1. Each of the horizontally extending headers 122 include a narrow longitudinally extending slit portion 127 formed along adjacent sides of the header. Thus, each of the headers 122 are located above the vertically extending side walls (now shown) which separate each of the adjacent tanks from one another. That is, by way of example, there is an individual plating tank 129 located in the space between each adjacent one of the transversely extending headers 122. Virtually all noxious vapors which rise from each of the individual plating tanks are drawn into the slits 127 formed in the headers 122 and are thereby exhausted through the vertical user tubes 125 and out the exhause manifold 126. Thus, there is virtually no odor. The plating system of the present invention is virtually odorless which renders the system an environmentally desirable place for workers.

Still referring to FIG. 3, the panel 112 is lowered via cables 107 and 108, into each of the successive tanks comprising the array tanks 121 for a brief period of time controlled by a computer. The panel 112 is then raised to an up position and transported along rails 101 and 102 via the truck 106 and is then again lowered in to the next adjacent tank. In order to assist with the transfer operation of the panel 112 from tank to tank, a plurality of guide hoops 130 are located about the center of each of the headers 122. In the event there is any transverse movement of the panel as it is being lowered or raised from a tank the panel contacts one of the guide hoops 130 which smoothly guides the panel into or out of a tank.

Referring next to FIG. 10, there is shown a perspective view analogous to that shown in FIG. 3, but wherein the panel to be plated 112 has been lowered into the tanks to make the requisite electrical connections to perform plating operations on the panel. In connection with FIG. 3, a plurality of exhaust headers extend transversely of the plating tanks with each being located above a wall separating adjacent ones of those tanks of one another. The vacuum headers 122 are closed on one end by a cap 123 and connected at the other end via a joint 124 to a collection system delivering the noxious vapors to an air scrubber. The copper straps 133 are configured into v-shaped grooves 134 at the center of each of the plating tanks. When the cables 107 and 108 supporting a panel 112 to be plated are lowered from their truck, the conductive relationship with the v-shaped grooves 134. Thus, when the cables 107 and 108 are extended to the point that the tension therein is relaxed except for that produced by the lead weights 113 and 114, the plating operation is performed on the panel. Plating current is conducted through interface between the grooved strap 134 and the bar 115.

Referring back to FIG. 3, an additional feature is shown and comprises an insulative elongate mounting member 131 slidably affixed to the upper edge of the tanks by means of insulative guide members 132. Attached to the top of the member 131 is a conductive copper strap 133 which is formed into a plurality of v-shaped grooves 134. Between adjacent ones of the grooves 134 the copper strap 133 is connected to a plating current power source by means of a plurality of cables 135. The insulative mounting members 131 and the copper straps affixed thereto oscillate back and forth along both opposed upper edges of the tanks 121. The horizontal mounting members 131 each have one end affixed to a bell crank mechanism 136 which is pivotally attached at one end 137 to the support member 131 and is pivotally attached at the other end 138 to the peripheral portion of a drive disc 139. The support member on the other side of the tank 131 is similarly connected to an identical bell crank mechanism such that when the disc 139 is rotated in the direction of the arrow 140 it causes the support members 131 to be oscillated horizontally back and forth in the directions of the arrow 141. When the panel 112 is lowered into one of the tanks, the ends of the conductive support rod 115 comes to rest with one end 115a positioned in the bottom of one of the grooves of the v-shaped copper strap 134. The other end 115b of the conductive support rod 115 comes to rest in the bottom of one of the v-shaped grooves of the other copper strap 133. With both the support members 131 oscillating in the directions of the arrow 141, the panel 112 is thus moved slightly in a direction normal to its planar surfaces whereby plating fluid in the tank is washed through the holes drilled through the surface of the board to assure thorough thru-hole plating. A reliable electrical connection is maintained with the plating power source by means of redundant connections 115a and 115b with the respective v-shaped copper straps 133 and 134.

Figure 4:
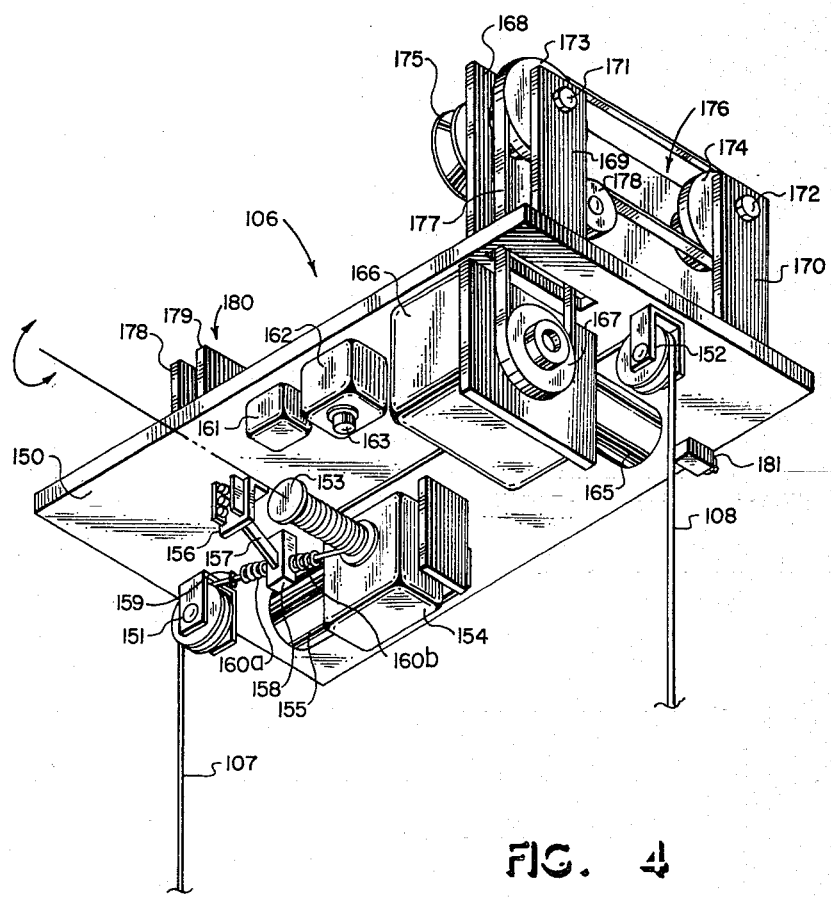
FIG. 4 is a bottom perspective view of a printed circuit board conveying truck used in conjunction with the invention.

Referring now to FIG. 4, there is shown a lower perspective view of a truck 106 constructed in accordance with the teachings of the present invention. The truck 106 consists of a central horizontal mounting plate 150 which has affixed to the underside thereof a pair of pulleys 151 and 152 across which are trained a pair of positioning cables 107 and 108. The upper ends of the cables 107 and 108 are wound about a cable winding capstan 153 which is connected through a gear box 154 to a winding motor 155. The cable capstan 153 is actuated under the control of a direction switch 156 which includes an actuation lever 157 connected to a block 158. Cable 107 includes a lower collar portion 159 which is integrally connected to the cable. When the cable 107 is reeled into the fully rewound position the collar 159 passes through the pulley 151 to press against a spring member 160a and move the actuation arm 157 and block 158 to the position shown. The spring member 160 provides the snap action to the operation of the switch 156. Similarly, the upper end of the cable 107 wound upon the capstan also includes a collar (not shown) which snaps the spring member 160b, the block 158 and the lever arm 157 to the opposite position from that shown whenever the cable 107 is unwound to the full down position. The switch 156 is more fully discussed below with respect to its function in the control circuitry of truck 106.

Also mounted to the underside of the plate 150 are a pair of control relays 161 and 162. The delay relay 162 includes an adjustable potentiometer 163 to control an RC circuit and adjust the delay after application of power before the relay operates. The underside of the plate 150 additionally mounts a forward drive mechanism which includes a forward drive motor 165 which is coupled through a gear box 166 to a drive pulley 167. Mounted directly above the forward drive mechanism on the upper surface of the plate 150 is a vertically extending mounting plate 168 and a pair of mounting bars 169 and 170. Journaled through the mounting plate 168 and the mounting bars 169 and 170 are a pair of axles 171 and 172 which have affixed, respectively, to first ends thereof a pair of drive pulleys 173 and 174 and to the other ends thereof a pair of drive wheels 175 and 176 (not shown). The drive wheels 175 and 176 are adapted for riding engagement with the upper surface of the outer drive rail 101 (FIG. 3). A driving belt 177 is trained around the motor pulley 167 across both of the drive pulleys 173 and 174 back across an idler pulley 178. Drive wheels rotate 175 and 176 when the motor 165 is actuated. Also on the upper surface of the plate 105 at the opposite end from the drive wheels 175 and 176 are located a pair of upstanding mounting plates 178 and 179 which mounted an idler wheel 180 (not shown). The underside of the plate 150 also mounts a shut off switch 181 which projects forwardly of the leading edge of the plate 150 and functions such that in the event a malfunction occurs and one truck catches up with the next truck ahead of it, the switch 181 will be actuated to disable the truck forward drive mechanism and disables any further actuation of the truck until the truck ahead of it moves on.

Figure 5:
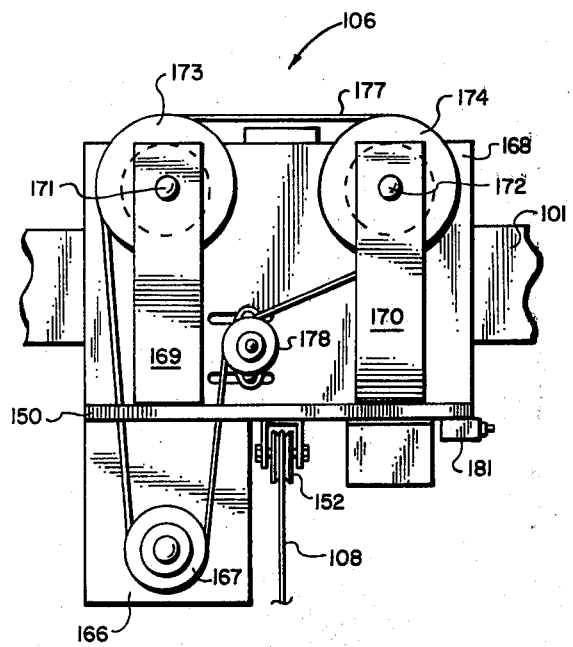
FIG. 5 is a right-end view of a truck shown in FIGS. 3 and 4.
Figure 6:
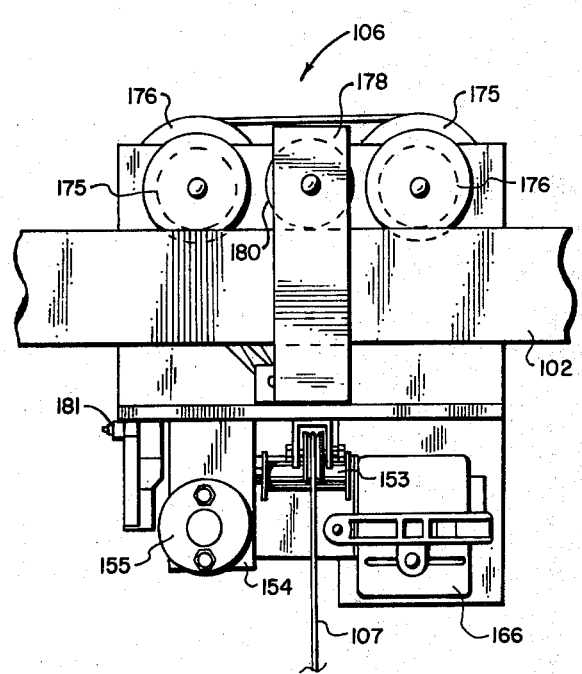
FIG. 6 is a left-end view of the truck shown in FIGS. 3 and 5.
Figure 7:
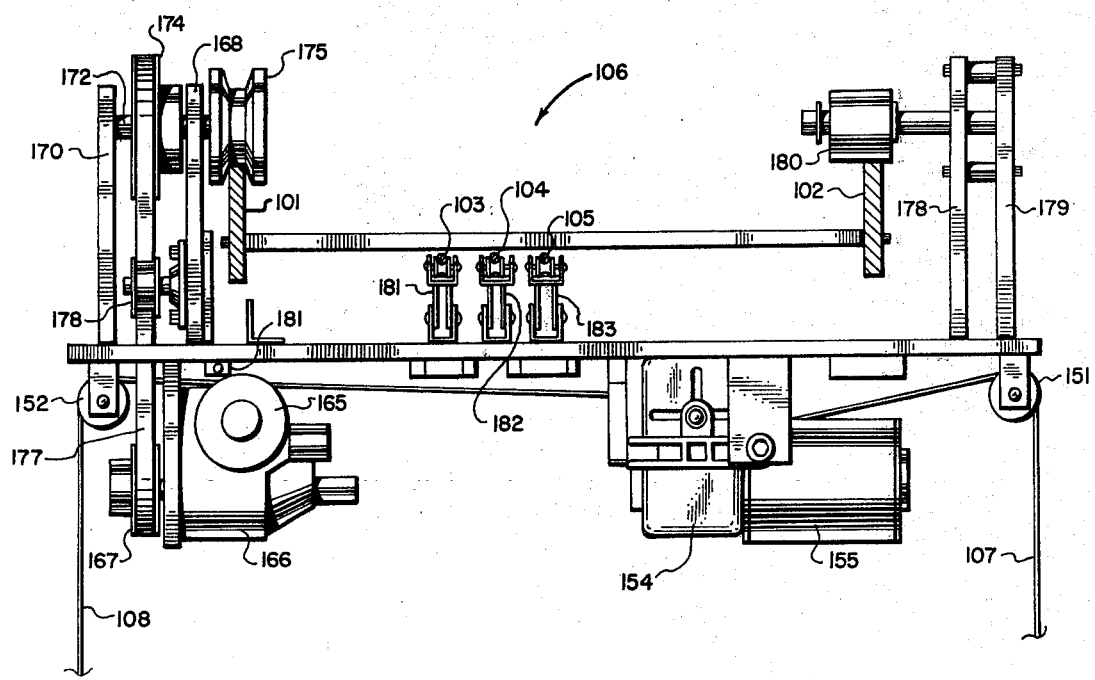
FIG. 7 is a front view of the truck as shown in FIGS. 3 and 4.
Figure 8:
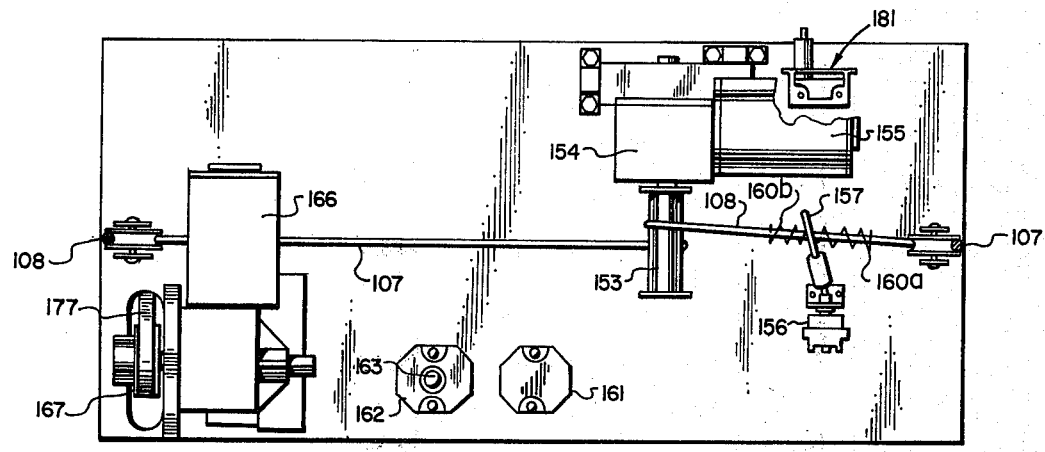
FIG. 8 is a top view of the truck as shown in FIGS. 3 and 4.
Figure 9:
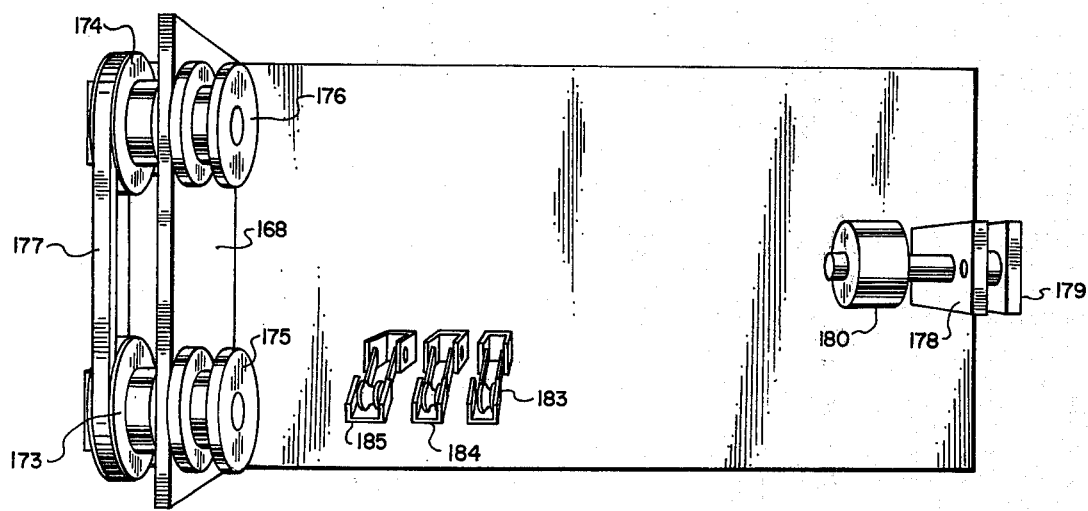
FIG. 9 is a bottom view of a truck shown in FIGS. 3 and 4.

Referring now to FIGS. 5, 6, 7, 8 and 9, there are shown respectively therein a right end view, a left end view, a front view, a bottom view and a top view of the plating trolley truck constructed in accordance with the teachings of the invention. As shown in those figures, the drive gearbox 166 is connected via a drive pulley 167 to a pair of drive pulleys 173 and 174 by means of a belt 177 trained around those pulleys and an idler pulley 178. The drive wheels 175 and 176 are adapted for engagement with a top edge of trolley rail 101. Because of the semicircular curves through which the tracks 101 and 102 follow on their paths above the plating tanks, the innermost of each truck is constructed in the form of an idler wheel 180 which rides along the upper edge of the trolley track 102. FIGS. 5, 6 and 7 also illustrate the manner in which the cables 107 and 108 are reeled in and out by means of the capstan winding reel 153 driven by the winding motor 155 coupled through a gear mechanism 154. As specifically shown in FIG. 7, three control busses 103, 104 and 105 are located between the trolley rails 101 and 102 parallel to the lower edges thereof and are in contact with the truck 106 by means of three spring biased contact arms 181, 182 and 183. These three busses comprise a power lead 103, a ground lead 104 and a control lead 105 for controlling the operation of the trolley truck 106 in a manner which will further be discussed below. Contactors 181, 182 and 183 are spring biased upwardly such that when the trolley wheels 175, 176 and 180 are placed upon the trolley rails 101 and 102 respectively, the contactors are brought into firm and reliable engagement with the under edges of the control bus bars 103, 104 and 105. Bus 103 is uninterrupted throughout its length and carries a constant power voltage. Bus 104 is also uninterrupted throughout its length and carries a constant ground potential. Bus 105 is segmented with each segment being associated with a different individual processing station directly beneath it, such as a cleaning or plating tank. Each segment of bus 105 is connected to a power voltage through a clock timer as will be more fully discussed below.

One aspect of the overall operation of the system of the invention is that printed circuit panels to be processed are fixed to cables which depend from each of the rail mounted trolley trucks. A truck moves into position in direct vertical alignment with a processing tank and when in position, circuitry is operated to cause the depending cables to lower the panel into the tank. Once in the tank, a clock timer controls the time which the panel remains in the tank. Upon passage of a preselected time period, the cable capstan motor is operated to raise the panel above the tank, the truck drive motor is operated to move the truck down the trolley track to a point in direct vertical alignment with the next contiguous processing tank. When the truck is positioned circuitry is actuated to lower the panel into the tank and start the cycle over under control of a different clock timer.

Referring now to FIG. 11, there is shown an array 200 of clock timers 201-260. In the array shown there are sixty clock timers 201-260. Each timer 201-260 is associated with a different, individual processing station, such as a particular cleaning or plating tank. Each timer controls the application of a voltage to a segment of a "timed power" bus bar 105 (FIG. 7).

Figure 12:
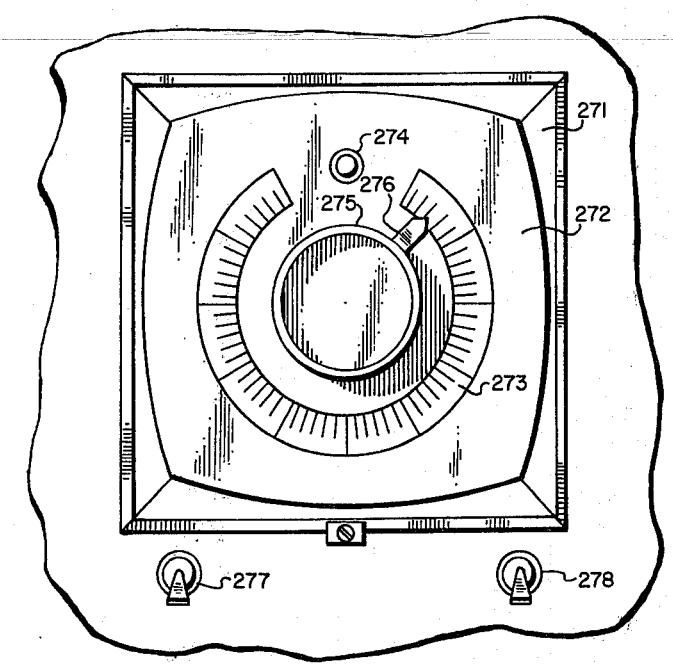
FIG. 12 is a front view of one of the timers shown in the array of FIG. 11.

As shown in FIG. 12, each clock timer includes an outer frame 271 and a dial 272. The dial 272 includes time indicia 273 and an operation indication lamp 274. Switches 277 and 278 permit timing interruption and other overrides of the timer. An adjustment knob 275 having a dial pointer 276 enables the selection of the desired time period through which the clock timer will operate prior to resetting itself and beginning the timing cycle over again. Different processing operations require different times so each station may be adjusted individually. As the clock timer reaches the reset point a contact within the timer closes and a "timed power" voltage is applied to a timed power bus segment 105 located above a processing station which is associated with that particular timer. Application of the "timed power" voltage causes withdrawal of a panel being processed from within the processing tank and movement of the carrying trolley truck to the next contiguous station as described below in connection with FIG. 13.

Figure 13:
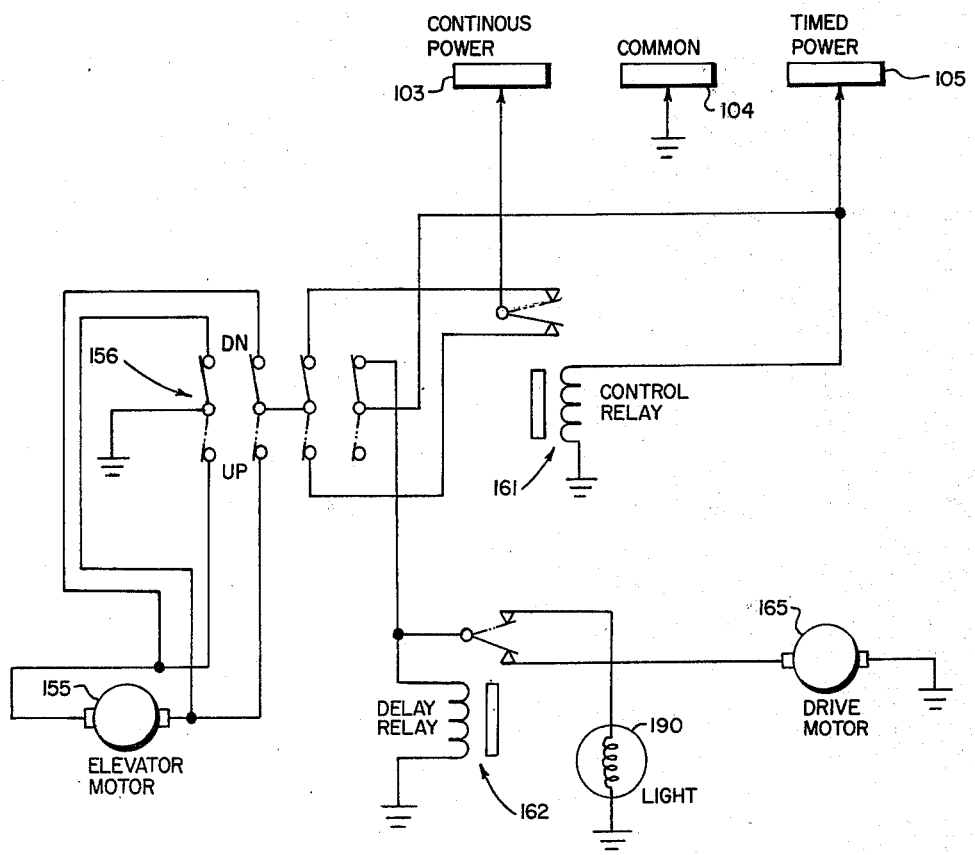
FIG. 13 is a schematic diagram of a system which controls the operation of the printed circuit board conveying trucks in accordance with the teachings of the invention.

Referring now to FIG. 13, there is shown a schematic diagram of the trolley truck control circuitry. The bus 103 is continuous in length and carries a continuous voltage potential, e.g., 24 volts. The bus 104 is also continuous in length and carries a continuous ground potential. The bus 105 is segmented in length with each segment being connected to a different one of the clock timers 201-260 for the periodic application of a voltage potential to the bus, i.e., timed power. The interruptions between contiguous sections of the timed power bus 105 are located such that contactor 183 (FIG. 7) passes from one segment of the bus to the next at a point when the trolley truck is located directly above a particular processing station, such as a cleaning or plating tank.

In FIG. 13, the timed power bus 105 is connected to the winding of control relay 161 and to one of the moveable poles of the four pole double throw switch 156. The continuous power bus 103 is connected through the moveable contact of the control relay 161 to either of two opposed fixed poles of the switch 156. Both the winding and the moveable contact of the delay relay 162 are connected to a fixed pole of the switch 156. The open fixed contact of the delay relay is connected to an indicator lamp 190 while the closed fixed contact is connected to the drive motor 165. The windings of the reversable capstan or elevator motor 155 are connected in one direction through two fixed contacts of the switch 156 and in the opposite polarity through the two opposed fixed contacts of the switch 156. While ground is shown as fixed common for all components in FIG. 11, it should be understood that all ground connectors are made through the anti-collision switch 181 (FIGS. 4, 5 and 7) so that if that switch is actuated by the truck bumping the truck ahead of it, all circuitry is interrupted until the truck ahead moves on and the trucks cease physical contact with one another.

In describing the operation of the circuit of FIG. 13, we will first assume "timed power" is off, the switch 156 is in the "up" position (shown with solid contacts) and the two relays 161 and 162 are unoperated (shown with dashed contacts). Continuous power from bus 103 is applied through the unoperated contact of the control relay 161 and the solid contacts of the switch 156 to cause the elevator motor to run "down" and lower a panel into a tank. As described above when the elevator cables are fully extended, the switch 156 is flipped to the "down" position (shown with dashed contacts) and the elevator motor stops. The truck remains in this configuration with plating or other processing being performed on the panel in the tank as long as no voltage is applied to the "timed power" bus 105 by the clock timer associated with that particular processing station. When the processing is timed out by the associated clock timer, power is applied to the bus 105 and the control relay 161 is operated to pull the contact down (solid position) and apply a voltage from the bus 103 to the elevator motor 155 in a direction to cause the motor to run "up" and raise the panel from within the tank. As described above, when the elevator cables are fully retracted the switch 156 is flipped to the "up" position (shown with solid contacts) and the elevator motor stops. The panel is now suspended clear of the tops of the processing tanks. When the switch 156 flips "up" timed power is applied to the windings of the delay relay 162 and after a preselected period of time the relay operates (shown with solid contact) to apply power to the drive motor 165. The drive motor 165 causes the trolley truck to move down the tracks until the contact arm 183 (FIG. 7) passes off the powered segment of the timed power bus 105. Interruption of the timed power from the bus 105 causes the cycle to begin again with lowering of the panel into the next successive processing station, under control of a different clock time associated with that particular station.

It is thus believed that the operation and construction of the present invention will be apparent from the foregoing description. While the apparatus as shown and described has been characterized as being preferred it will be obvious that various changes and modifications may be made therein without departing from the spirit and scope of the invention as defined in the following claims.

What is claimed:

1. A continuous article processing system, comprising:
    a series of sequentially arranged article treatment tanks;
    a trolley track formed in a loop with a portion of said track overlying said treatment tanks, said track including two rails disposed one from the other in generally parallel spaced alignment;
    a plurality of trolley trucks mounted for movement upon said track, each said trucks including means for supporting an article to be processed and energizable vertical drive means for raising and lowering said article into and out of said processing tanks;
    energizable horizontal drive means for moving each of said trolley trucks along said track;
    a set of control busses, including a power bus, a ground bus and a control bus, extending around the loop between said trolley rails, said power and ground busses being continuous and said control bus being segmented with the interruptions therein located directly above each of said treatment tanks;
    means mounted on said trolley trucks for engaging each of said busses;
    an automatically resetting timer associated with each of the segments of said control bus;
    control means responsive to said timer reaching a preselected value for applying power to said control bus to sequentially energize said vertical drive means and raise said article, to energize said horizontal drive means and energize said horizontal drive means and advance the trolley out of engagement with that segment of control bus and into engagement with the next successive segment, and to energize said vertical drive means and lower said article into the next successive treatment tank under control of the timer associated with the next successive segment of the control bus.

2. A continuous article processing system as set forth in claim 1 wherein a pair of cables depend from said trolley trucks, each of said cables being connected to a single capstan drive for simultaneous reeling and unreeling.

3. A continuous article processing system as set forth in claim 2 wherein each of said pair of cables depending from said trolley truck includes a weight secured to said cable for maintaining tension thereon.

4. A continuous article processing system as set forth in claim 1 wherein said articles are printed circuit boards and said pair of cables depending from said trolley truck is connected to a printed circuit board support carriage comprising a horizontal support bar and a plurality of generally vertically depending support elements for securing said printed circuit board thereto, said horizontal support bar and depending support elements being constructed of conductive material for providing a conductive path to said printed circuit board from said horizontal support bar.

5. A continuous article processing system as set forth in claim 4 wherein said treatment tanks include treatment fluid therein and means for providing electrical current between said printed circuit boards and said fluid, said means including a conductive strap disposed adjacent each of said tanks for electrically engaging said horizontal support bar.

6. A continuous article processing system as set forth in claim 5 wherein said conductive strap is constructed with a V-shaped groove for receiving said horizontal support bar therein.

7. A continuous article processing system as set forth in claim 6 wherein said conductive strap comprises a plurality of V-shaped grooves with separate grooves disposed adjacent said sequentially arranged treatment tanks.

8. A continuous article processing system as set forth in claim 7 wherein each of said grooves of said strap is connected to a plating current power source by a separate power cable.

9. A continuous article processing system as set forth in claim 7 wherein said conductive strap rests atop said treatment tanks upon an insulative mounting member, said mounting member being connected to means for reciprocating said mounting member adjacent said treatment tanks for oscillating said V-shaped grooves back and forth.

10. A continuous printed circuit board processing system as set forth in claim 1 wherein:
said printed circuit board supporting means includes a pair of cables depending from each of said trolley trucks; and
said board raising and lowering means includes a reversable capstan motor for reeling and unreeling said cables.

11. An improved printed circuit board processing system as set forth in claim 10 wherein said pair of cables depending from said trolley truck is connected to a printed circuit board support carriage comprising a horizontal support bar and a plurality of generally vertically depending support elements for securing said printed circuit board thereto, said horizontal support bar and depending support elements being constructed of conductive material for providing a conductive path to said printed circuit board from said horizontal support bar.

12. An improved printed circuit board processing system as set forth in claim 10 wherein said pair of cables depending from said trolley truck is connected to a printed circuit board support carriage comprising a horizontal support bar and a plurality of generally vertically depending support elements for securing said printed circuit board thereto, said horizontal support bar and depending support elements being constructed of conductive material for providing a conductive path to said circuit board from said horizontal support bar.

13. An improved printed circuit board processing system of the type including a series of printed circuit board treatment tanks for treating a printed circuit board lowered therein, said tanks containing treatment fluids of the noxious vapor variety, wherein said improvement includes:
a trolley track formed in a loop with a portion of said track overlying said treatment tanks disposed thereunder in sequential arrangement;
a set of control busses, including a power bus, a ground bus and a control bus, extending adjacent said track, said power and ground busses being continuous and said control bus being segmented with the interruption therein located directly above each of said treatment tanks;
a plurality of trolley trucks mounted for movement upon said track, each of said tracks including means for supporting a printed circuit board to be processed, energizable vertical drive means for raising and lowering said board into and out of said processing tanks and means for engaging said control busses;
energizable horizontal drive means for moving each of said trolley trucks along said track;
an automatically resetting timer associated with each of the segments of the control bus;
control means responsive to said timer reaching a preselected value for applying power to said control bus to sequentially energize said vertical drive means and raise said printed circuit board, to energize said horizontal drive means and advance the trolley out of engagement with that segment of control bus and into engagement with the next successive segment and to energize said vertical drive means and lower the printed circuit board into the next successive treatment tank under control of the timer associated with the next successive segment of the control bus; and
means for collecting and removing noxious vapor from said treatment tanks.

14. An improved printed circuit board processing system as set forth in claim 13 wherein said noxious vapor collection and removal means comprises:
a plurality of transversely extending headers, each header having a slit portion for receiving said noxious vapor therein and being disposed adjacent said treatment tank;
a manifold in flow communication with said headers; and
a suction system coupled to said manifold for drawing said noxious vapor therein.

15. An improved printed circuit board processing system as set forth in claim 14 wherein said suction system includes an air scrubber.

16. An improved printed circuit board processing system as set forth in claim 13 wherein said trolley track includes two rails disposed one from the other in generally parallel spaced alignment.

* * * * *

UNITED STATES PATENT AND TRADEMARK OFFICE
CERTIFICATE OF CORRECTION

PATENT NO. : 4,337,134

DATED : June 29, 1982

INVENTOR(S) : Richard O. Norman

It is certified that error appears in the above-identified patent and that said Letters Patent are hereby corrected as shown below:

Column 2, line 64, after the word "for", delete "for".

Column 3, line 3, read --having-- for "havisng".

Column 3, line 66, read --machine-- for "maching"

Column 5, line 66, read --room-- for "toom".

Column 7, line 48, delete "user" and insert "riser"

Column 7, line 48, read --exhaust-- for "exhause"

Column 7, line 55, after the word "array", insert "of"

Column 8, line 14, delete "the", insert

"they come into a"

Column 9, line 39, after the word "wheels", delete

"rotate"

UNITED STATES PATENT AND TRADEMARK OFFICE
CERTIFICATE OF CORRECTION

PATENT NO. : 4,337,134

DATED : June 29, 1982

INVENTOR(S) : Richard O. Norman

It is certified that error appears in the above-identified patent and that said Letters Patent is hereby corrected as shown below:

Column 9, line 39, after "176" insert -- rotate --

Signed and Sealed this

Seventh Day of December 1982

[SEAL]

Attest:

GERALD J. MOSSINGHOFF

*Attesting Officer*  *Commissioner of Patents and Trademarks*